United States Patent [19]
Schwabe et al.

[11] Patent Number: 4,982,154
[45] Date of Patent: Jan. 1, 1991

[54] METHOD OF ENGAGEMENT OF ELECTRICAL CONTACTS TO PIPE MEMBERS

[75] Inventors: Robert J. Schwabe; Louis F. Coffin, both of Schenectady; Michael R. Eggleston, Scotia, all of N.Y.

[73] Assignee: General Electric Company, Schenectady, N.Y.

[21] Appl. No.: 501,054

[22] Filed: Mar. 29, 1990

[51] Int. Cl.5 .................... G01R 1/04; G01R 1/067
[52] U.S. Cl. ...................... 324/158 P; 324/158 F; 324/515; 324/718; 439/197
[58] Field of Search ............ 324/158 P, 158 F, 72.5, 324/713, 714, 715, 718, 716, 357, 368, 515, 522, 523, 525, 724; 200/175, 23, 239; 439/132, 197

[56] References Cited

U.S. PATENT DOCUMENTS

| 1,895,643 | 1/1933 | Putnam | 324/716 |
| 2,440,044 | 4/1948 | Greenslade | 324/718 |
| 2,883,638 | 4/1959 | Mark | 439/197 |
| 3,025,460 | 3/1962 | Callan et al. | 324/515 |
| 3,370,226 | 2/1968 | Widmer | 324/515 |
| 4,133,992 | 1/1979 | Walker et al. | 439/197 |
| 4,629,991 | 12/1986 | Wheeler | 324/232 |
| 4,656,595 | 4/1987 | Hognestad | 324/718 |

Primary Examiner—Reinhard J. Eisenzopf
Assistant Examiner—William J. Burns
Attorney, Agent, or Firm—Paul E. Rochford; James C. Davis, Jr.; James Magee, Jr.

[57] ABSTRACT

A scheme for rapidly connecting and rapidly disconnecting a large number of point contacts onto a pipe surface is taught. The scheme involves pressing sharply pointed pin contacts onto the pipe surface by gas pressure. Each pin is held in a conforming opening in an annular ring structure. The ring forms the inner wall of an annulus capable of holding gas pressure to urge the many needles inward against the pipe surface. Each pin is individually connected to a power supply and sensing apparatus.

9 Claims, 3 Drawing Sheets

METHOD OF ENGAGEMENT OF ELECTRICAL CONTACTS TO PIPE MEMBERS

BACKGROUND OF THE INVENTION

The present invention relates generally to applying currents and making electrical measurements on cylindrical members such as pipes. More particularly it relates to facilitating the engagement or attachment of multiple electrodes or contacts to the external surface of a pipe and also to facilitating removal of such multiple electrical contacts from a pipe surface.

Studies have been made as part of an overall effort to improve the performance of pipes and other such structures relative to damage from flaws in the structures which can lead to cracking in the walls thereof. One of the types of cracking which has received and which deserves special attention is stress corrosion cracking. Such type of cracking occurs where the pipe element serves to contain high temperature, high pressure steam, water, or other fluids.

One way which has been very effective in studying the cracking which occurs within a pipe wall is by making electrical measurements of the pipe and observing changes in electrical potential and flow of current in the pipe both before and after the cracking has been initiated and as the crack grows.

To study the cracking phenomena within pipe walls and other elements, it is frequently desirable to make many measurements essentially around the entire circumference of the pipe and also to make similar measurements along the length of the pipe from one contact point to another spaced axially along the length of the pipe.

Where the application of a large number of current patterns and the measurement of a large numbers of voltages on pipe members can be accomplished, the data which is generated from such measurements can be used in the so called Electric Current Computed Tomography or ECCT. ECCT is a practice in which determination can be made of the condition of the pipe itself from the electrical measurements made with the aid of the many surface contacts which are attached to the pipe.

Accordingly, a central problem in the use of the ECCT technology is the making of a large number of electrical contacts precisely on a pipe surface to permit the application of currents and the measurement of voltages and the critical data to be collected. The present method is one for facilitating the rapid attachment of a large number of contacts to a pipe surface and the removal of the large number of contacts from a pipe surface.

What is needed in connection with making ECCT measurements of piping is reliable electrical contact of many elements at a pipe surface. The contact to be effective electrically, must be one which does not change with time. Further the contacts must be evenly spaced both along the pipe and about the pipe in order to provide the proper geometry to accumulate the data needed for ECCT type of analysis and study.

Alternatively, the method can be applied to the measurement of voltages as part of techniques where current attachments are made external to the fixture.

BRIEF DESCRIPTION OF THE INVENTION

Accordingly one object of the present invention is to provide a scheme by which electrical contact can be made easily in a pattern on a pipe surface to permit current application and electrical measurements of the pipe to be made.

Another object is to provide a simple means by which a large number of contacts can be made in an accurate geometric pattern to permit the accumulation of data for Electric Current Computed Tomography.

Another object is to provide a method for rapid attachment of a large number of contacts at a pipe surface and also for the disengagement of the contacts from the pipe surface with great facility.

Other objects and advantages of the present invention will be in part apparent and in part pointed out in the description which follows.

In one of its broader aspects the objects of the present invention can be achieved by providing a hollow annular pneumatic tube having a gas inlet for establishing a gas pressure in the interior of the tube. A multiplicity of pin holes is provided on the inner annular wall of the annular pneumatic tube. One pin shaped electrical contact element is provided in each of the multiplicity of pin holes through the inner annular wall of the pneumatic tube. Each of the pin elements is conducting and each one has a separate electrical connection extended therefrom to a data collection apparatus. Means are also provided for developing and maintaining a gas pressure in the interior of the annular tube so that the multiplicity of pins extending through the inner wall of the tube are urged through the wall into contact with a cylindrical object mounted within the opening of the annular tube.

BRIEF DESCRIPTION OF THE DRAWINGS

The detailed description of the invention which follows will be understood with greater clarity if reference is made to the accompanying drawings in which.

DETAILED DESCRIPTION OF THE INVENTION

Electric Current Computed Tomography (ECCT) is a new technology directed toward examining the internal structure of pipe walls and internal structure of other metal elements. ECCT is accomplished by applying a set of electric contacts to a structure, applying electric current flow through the structure and measuring voltages from one contact point to another. Greater resolution of the structure of the pipe walls and of other structural elements is achieved if a greater number of contact points are provided. Additionally, it is important to have a precise location for the contact points. Thus if a contact is made over an area of one square centimeter it is difficult to tell within the square centimeter precisely where the electrical contact occurs. If however there are separate electrical contacts for every square millimeter of the square centimeter, the current can be more uniformly distributed over the surface at precise locations. The voltage in turn can be measured at a single non-current carrying point allowing for greater precision to be achieved in determining the internal state of the object being examined.

The ECCT technique requires electrodes with a uniform current flow over a large area. The main reason for individual point contacts within an electrode is that uniform contact cannot be made between a single large electrode and the pipe surface, because of surface roughness and varying contact resistance. Therefore, the large electrode concept is realized by an array of point contacts, each contact having good and uniform electrical contact with the wall.

Pursuant to the present invention a multiplicity of electrode contacts are made with the external surface of a conducting object. Each of these contacts is made by a impressing a point contact to engage the surface of the object at a precise location. The precise location is achieved by having a small contact area for the electrode and more specifically in the form of a contact point. Precise location is also achieved by having the point electrodes carefully guided as they are impressed against the pipe wall.

Figure 1:
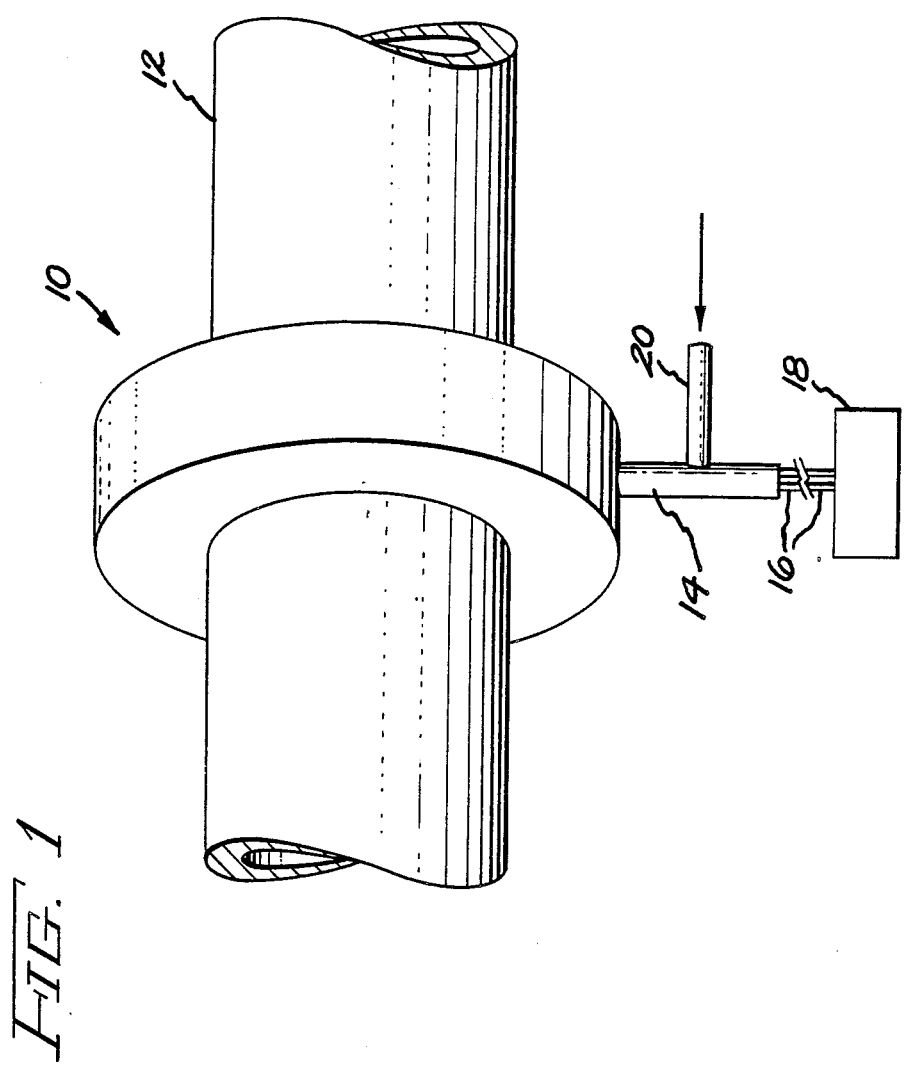
FIG. 1 is a perspective side elevation of an annular electrode fixture as provided pursuant to the present invention with a pipe extended through the annular opening thereof.

A better idea of the way in which this is accomplished may be given with reference to the figures. Referring now first to FIG. 1, this figure is an isometric side elevation of an annular ring 10 mounted over a pipe 12. The pipe passes through the annulus of the ring. The ring 10 is positioned at a location along pipe 12 at which it is desired to take measurements. It will of course be understood that more than one ring can be used at a time and that positions along the pipe 12 can be selected so that measurements can be made between any points desired along pipe 12.

The ring 10 has a tube 14 extending therefrom. The tube 14 is the means by which electrical conductors 16 extend from the interior of the ring to an external current generation and data collection unit 18.

A side tube 20 extending from tube 14 provides admission of a gas to pressurize the interior of the ring 10 from a gas source which is not shown.

Figure 3:
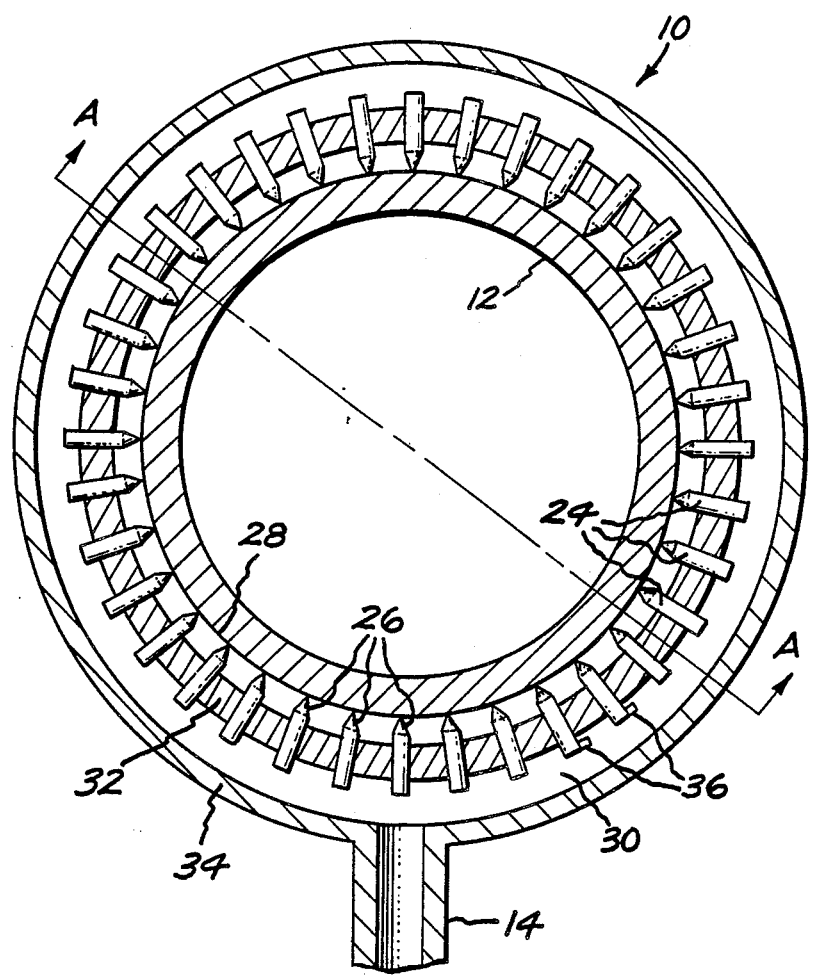
FIG. 3 is a radial section through the annulus of FIG. 1 and through the pipe mounted within the annulus of FIG. 1.

Turning now next to FIG. 3 a radial section of the ring 10 and pipe 12 is shown. Pipe 12 resides internally of the annular ring 10 and essentially coaxial therewith. The interior view of the ring 10 makes evident that there are a large number of pin openings through an internal wall 32 of the annular ring 10. Each of the pin openings has a pin member 24 extended therethrough so that there are a multiplicity of pin openings in the inner wall 32 of the ring 10 and there are corresponding number of pins extended through the openings and directed toward the outer surface of the pipe 12. Each of the pin openings and of the resident pins located within the openings are aimed at the central axis of the ring 10. Each of the pins has a pointed inner end 26 which bears against the outer surface 28 of pipe 12.

The outer diameter of each pin shaft corresponds very closely to the inner diameter of the pin openings so that there is a sufficient clearance therebetween for easy movement of the pins in the openings to permit the pins to be urged inwardly toward the outer surface 28 of pipe 12, yet preventing excessive lateral movement to satisfy accurate positioning.

As indicated above, the tube 14 is connected to a gas supply which provides a supply of gas to develop a positive pressure within the plenum 30 between the inner wall 32 and the outer wall 34 of the annular ring member 10. By having a positive gas pressure within the plenum 30, the result is that the pins are continuously urged inward against the outer wall 28 of the pipe 12. Because the inner ends 26 of the pins are pointed, each pin makes a point contact with the outer surface 28 of the pipe and provides a discrete spot at which the pin bears on and engages the outer surface 28 of the pipe and makes electrical contact therewith.

The electrical connections from the individual pins 24 to the power supply and data accumulating control box 18 are not shown in order to preserve some clarity of illustration in FIG. 3.

To prevent the pins 24 from passing through inner wall 32 of the annular ring 10 when the pipe 12 is not present inside the ring 10, tabs 36 may be formed on or attached to inner ends of the pins 24 to act as stops for the egression of the pins from the respective openings in the inner wall 32 of the annular ring 10.

For the example shown, the array of 36 pins around the annulus 10 provide 36 contacts at the pipe surface 28 as a result of pressuring the plenum 30 with a supply of gas through the tube 14. However, as is evident from the figure the ring array of pins as shown in the FIG. 3 makes contact at a single ring of points around the outer surface 28 of pipe 12.

Figure 2:
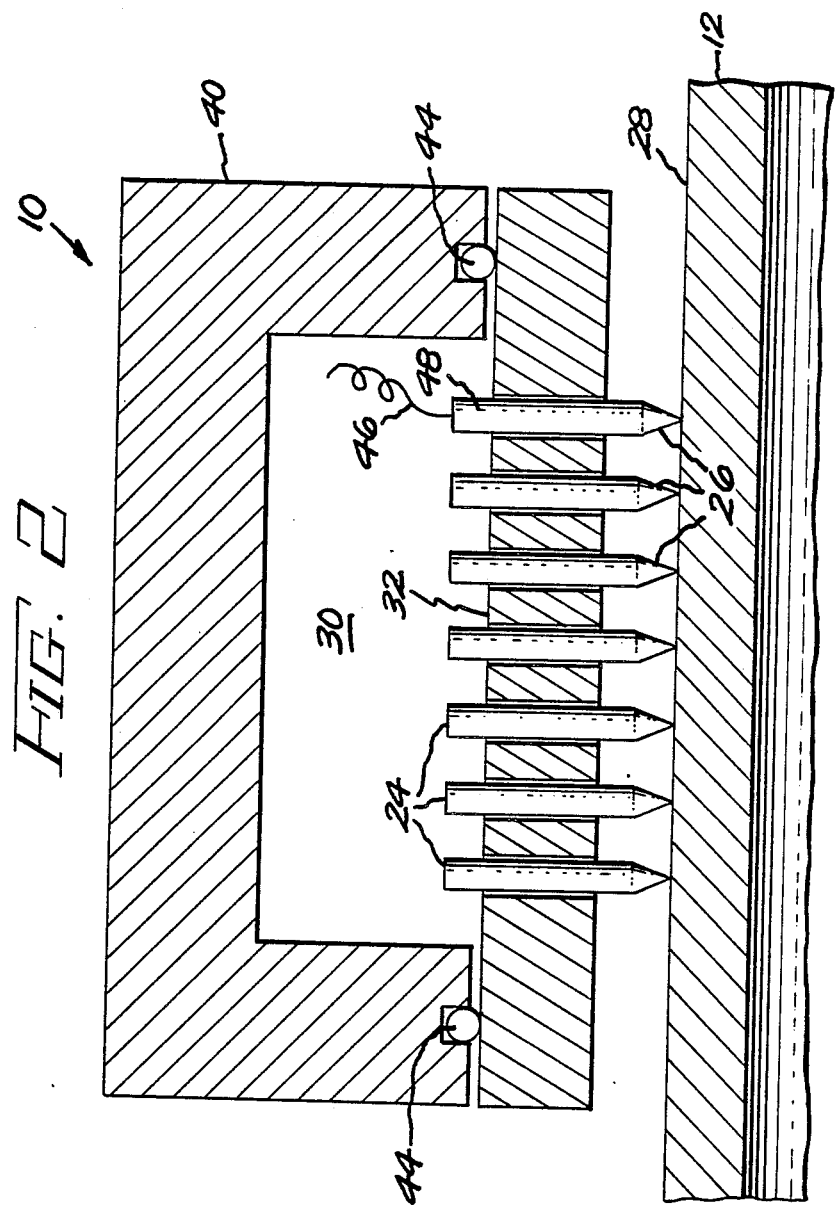
FIG. 2 is a radial section through the annulus of FIG. 1 and through a portion of the test pipe position within the annulus.

With reference now to FIG. 2, a detail of an axial section through annular tube 10 is displayed. As is evident from this figure the ring 10 is made up essentially of two parts the first part being an outer channel shaped element 40 and the second part being an inner band element 32. Pneumatic seals between the parts 40 and 32 of the ring 10 are provided by the o-rings seals 44. It is of course possible to form the annular ring 10 with parts of other shapes and forms but the structure is illustrated in FIG. 2 is a convenient combination of parts which permits the seal to be established so that the plenum 30 can be pressurized with a gas to permit the pins 24 to be urged out of the annulus and through the inner wall 32 to make point contacts with the outer surface 28 of the pipe element 12. By maintaining adequate pressure to the plenum, it is possible to continuously urge the pins 24 into point contact with the outer surface 28 of pipe 12. The inner wall 32 is a non-conducting wall so that each pin 24 is electrically isolated from each other pin and current can be applied to any pin and the potential on any pin can be measured and recorded in the data box 18 with the aid of wires which individual connect each pin with the relevant terminal in box 18. One such wire 46 is illustrated extending from the inner end of a pin 48 in plenum 30. It will be understood that, although not illustrated, each of the pins is equipped with an individual wire which extends to and connects the individual pin to the current generating and data collecting box 18.

For the example shown, the array of pins illustrated in FIG. 2 is an array of 7 pins. However, each pin is also part of a ring of pins extending around the pipe so that there are in fact 7 rings of pins extending around the pipe all of which are housed within annular ring 10. Accordingly it is possible through the present invention to establish contact with the pipe surface at literally hundreds of individual discreet points employing the method of the present invention as herein described.

Accordingly, the apparatus of the present invention provides a unique means for engagement and disengagement of a large number of current and electrical potential probes to a pipe or other cylindrical body quickly and reliably. Further the present invention provides a method which permits the introduction of current paths and the measurement of electrical potential such as are required in crack growth monitoring and in Electric Current Computed Tomography so that these procedures may be carried out in a greatly simplified manner and the prior time consuming tedious and some times risky task of spot welding electrical leads to pipe surfaces can be essentially eliminated.

Basically the method involves using a large number of hardened and sharply pointed metallic pins held in a non-conducting ring housing somewhat larger in diameter than the pipe. The pins are allowed to slide snugly in the ring in a radial direction so that can engage the pipe. The outer end of each pin extends into a pressurized plenum chamber formed within the ring housing. Current or electrical potential leads attached to each pin are directed through the walls of this chamber using a pressure resistant seal and passed into a current generation and data collection box 18.

With the application of sufficient air pressure to the circumferential plenum chamber, each pin is driven radially inward to engage the surface of the pipe and to establish electrical contact. Removal of the pressure releases the pins and allows for removal of the annular pin fixture. A simplified installation of the fixture can be made in to two halves forming a clamshell type configuration that can easily be put in place and clamped around the pipe. See in this regard the seam A—A of FIG. 3.

In the various application of the electrical potential methods to measurement of crack growth or ECCT measurements, it is important to know accurately the position of each current and potential electrode relative to some reference position in the pipe. Accurate location of each lead by the earlier procedure of spot welding is difficult due to the numerous number of contacts that must be made. Positioning of the electrodes can be performed reasonably accurately by prior art methods only when the pipe is cylindrical and the surface is smooth as by means of a scribed grid and can only be accomplished in the laboratory. However, when the pipe surface is rough, and in particular if a prior art welding technique is employed, positioning of the probes is difficult. However, by using the method described herein, each pin electrode makes a point contact with pipe wall regardless of surface roughness. Further the circumferential and axially position of each electrode depends only on the pipe diameter and on the dimensions of the non-conducting ring and can be determined to 0.001 to 0.002 inches.

The main reason that spot welding is not appropriate for the technique described herein are:

(1) too many leads to be practically attached to the pipe due to the physical and processing constraints, and
(2) the accuracy of spot welding at specific locations on pipe is not sufficient when welding is performed at the site (in the field).

A severe problem brought up by those interested in using the electrical potential technique for crack growth monitoring and for ECCT measurements is the time and cost consumed in attaching leads to the pipe by prior art spot welding techniques. In this respect it must be realized that the resolution of data obtained increases with the number of leads so that more leads rather than fewer leads are desired. However, the conditions for lead attachments by prior art methods are often far from ideal and the worker may encounter high temperature environment as well as difficulty of movement and radiation exposure from attempts to make ECCT measurements in nuclear applications. The present method removes the difficulties. Here the time of contact is very short and independent of the number of electrodes.

Another problem associated with the prior art methods is the permanency of the spot welded attachment of electrodes. Once electrodes are attached by spot welding they are affixed to the pipe wall. The present device can be easily removed so that all electrical connections are released. Moreover the device permits rapid movement of the electrodes to another location on the pipe where contact can be made by pressurizing the plenum 30 of the apparatus. Removal of the electrical contacts can also be done simply as a result of release of the pressure from the plenum 30.

Further it is possible using remote means for shifting the annular fixture 10 to reposition the apparatus and reestablish the contacts even during plant operation and in radiation fields but such relocation of the contacts was not possible by prior art methods.

A further problem which relates to the electrode design for ECCT application is the need for uniform current flow at the pipe wall over a large area. For example, if the pipe is a 10 inch OD pipe and 64 electrodes are used, each electrode has a circumferential dimension of approximately 0.5 inch. It is extremely difficult to devise a solid electrode to develop the uniform conductivity over an area of this size. The present method accomplishes this by providing many uniformly spaced electrical contacts over this area. If, for example, the electrode area is ½" by ½" then this area could be represented by some 16 individual pins all pressing equally hard into the pipe wall and giving a discreet uniformity of electrical contact. With this type of contact the whole measurement system is subject to much more accurate modeling through computer modeling techniques.

An apparatus such as is described above has been built and the structure has been operated experimentally. The non-conducting support ring for the array of pins was an acrylic plastic and the outer channel ring 40 was formed of aluminum alloy. A pressure was maintained using o-ring seals. The pins were formed from steel drill rod. In our experiments we found that it is preferred to have a contact force of at least 300 gms on each pin. For this purpose each pin had a diameter of about ⅛" and a internal pressure of 50 psi of air was required to establish the needed force on the pins to obtain the 300 gms contact pressure.

What is claimed is as follows:

1. Apparatus for making a multiplicity of electrical contacts about the surface of a cylinder which comprises, an hollow annular pneumatic tube,
a gas inlet to said tube for establishing a gas pressure in the interior of said tube,
a multiplicity of pin holes through the insulated inner annular wall of said annular pneumatic tube,
a like multiplicity of pointed metal contact pin elements in the multiplicity of holes in said inner wall,
each of said pin elements being conducting and each of said elements having an electrical lead extending therefrom to a current generation and data collection apparatus, and
means for developing and maintaining a gas pressure in said annular tube whereby the points of the multiplicity of pins are urged by said gas pressure to extend out of said pin holes and to press on the outer surface of a cylindrical object mounted within the center opening of said annular tube.

2. The apparatus of claim 1, in which the multiplicity of holes are in a ring extending entirely around the inner annular wall of the annular pneumatic tube.

3. The apparatus of claim 1, in which the pins are formed from steel drill rod.

4. The apparatus of claim 1, in which each of the pins has a diameter of about ⅛ inch.

5. The apparatus of claim 1, in which the pressure of the gas in the pneumatic tube is sufficient to apply a contact force of at least 300 grams to each of the pins.

6. The apparatus of claim 1, in which the pin population is such that within an area of about ½ inch by ½ inch there are at least 16 pins, each pressing equally hard on the surface of the cylindrical object.

7. The apparatus of claim 1, in which the inner wall of the annular tube is an insulating plastic.

8. The apparatus of claim 1, in which the inner wall of the annular tube is of an acrylic polymer.

9. The apparatus of claim 1, in which the internal gas pressure in said annular tube is about 50 psi.

* * * * *